(12) United States Patent
Nanbu et al.

(10) Patent No.: US 11,414,762 B2
(45) Date of Patent: *Aug. 16, 2022

(54) SUBSTRATE FOR FLEXIBLE DEVICE

(71) Applicant: TOYO SEIKAN GROUP HOLDINGS, LTD., Tokyo (JP)

(72) Inventors: Kouji Nanbu, Kudamatsu (JP); Toshihiko Miyazaki, Osaka (JP); Hirohisa Masuda, Osaka (JP); Hiroshi Shimomura, Osaka (JP)

(73) Assignee: TOYO SEIKAN GROUP HOLDINGS. LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/625,179

(22) PCT Filed: Jun. 18, 2018

(86) PCT No.: PCT/JP2018/023059
§ 371 (c)(1),
(2) Date: Dec. 20, 2019

(87) PCT Pub. No.: WO2018/235759
PCT Pub. Date: Dec. 27, 2018

(65) Prior Publication Data
US 2020/0141009 A1 May 7, 2020

(30) Foreign Application Priority Data
Jun. 23, 2017 (JP) .............................. JP2017-123379

(51) Int. Cl.
*B32B 15/04* (2006.01)
*C23C 28/00* (2006.01)
(Continued)

(52) U.S. Cl.
CPC ............ *C23C 28/345* (2013.01); *C03C 3/145* (2013.01); *C03C 8/04* (2013.01); *C03C 8/16* (2013.01);
(Continued)

(58) Field of Classification Search
None
See application file for complete search history.

(56) References Cited

U.S. PATENT DOCUMENTS

| 5,513,040 | A | 4/1996 | Yang |
| 8,236,111 | B2 * | 8/2012 | Murakami ............... C21D 1/76 148/320 |
| 9,024,312 | B2 | 5/2015 | Fukuda et al. |

FOREIGN PATENT DOCUMENTS

| EP | 2562141 A1 * | 2/2013 | ............ H01J 29/863 |
| EP | 2 925 089 A1 | 9/2015 | |

(Continued)

OTHER PUBLICATIONS

International Search Report for PCT/JP2018/023059 dated Sep. 18, 2018 (PCT/ISA/210).
Communication dated Jan. 28, 2021, from the European Patent Office in corresponding European Application No. 18819656.2.
Office Action dated Dec. 14, 2021 in corresponding Taiwanese Application No. 107121206.

*Primary Examiner* — Seth Dumbris
(74) *Attorney, Agent, or Firm* — Sughrue Mion, PLLC

(57) ABSTRACT

A substrate for a flexible device which includes a stainless steel sheet, a nickel plating layer formed on a surface of the stainless steel sheet, and a glass layer of electrical insulating bismuth-based glass formed in the form of layer on a surface of the nickel plating layer.

8 Claims, 1 Drawing Sheet

(51) Int. Cl.
  *C03C 3/145* (2006.01)
  *C03C 8/04* (2006.01)
  *C03C 8/16* (2006.01)
  *C23C 8/12* (2006.01)
  *C23D 5/02* (2006.01)
  *C25D 3/12* (2006.01)
  *C25D 5/50* (2006.01)
  *H01L 51/00* (2006.01)

(52) U.S. Cl.
  CPC ............... *C23C 8/12* (2013.01); *C23D 5/02* (2013.01); *C25D 3/12* (2013.01); *C25D 5/50* (2013.01); *H01L 51/0097* (2013.01); *Y10T 428/12611* (2015.01)

(56) References Cited

FOREIGN PATENT DOCUMENTS

| EP | 3 439 431 A1 | 2/2019 |
|---|---|---|
| JP | 01-141834 A | 6/1989 |
| JP | 2004-171806 A | 6/2004 |
| JP | 2006-80370 A | 3/2006 |
| JP | 2011-97007 A | 5/2011 |
| JP | 2011-126722 A | 6/2011 |
| JP | 2012-41196 A | 3/2012 |
| JP | 2014-107053 A | 6/2014 |
| TW | 281730 B | 7/1996 |

* cited by examiner

| SHEET | SURFACE (GLASS UNCOATED SURFACE) | END FACE |
|---|---|---|
| NK-430MA (EXAMPLE 2) | | |
| STEEL (COMPARATIVE EXAMPLE 5) | | |

SUBSTRATE FOR FLEXIBLE DEVICE

CROSS REFERENCE TO RELATED APPLICATIONS

This application is a National Stage of International Application No. PCT/JP2018/023059 filed Jun. 18, 2018, claiming priority based on Japanese Patent Application No. 2017-123379 filed Jun. 23, 2017.

TECHNICAL FIELD

The present invention relates to a substrate for flexible device. More specifically, the present invention relates to a substrate for flexible device, which has an excellent antirust property, a moisture barrier property, bending resistance and adhesion of an insulating layer, and which is free from surface defects, therefore, applicable preferably to equipment relating to organic EL.

BACKGROUND ART

A substrate for flexible device used in an organic EL lighting, an organic EL display, an organic solar cell or the like is required to have barrier properties such as a moisture barrier property and a gas barrier property, and further smoothness and insulation. In addition, the substrate is required to have excellent flexibility (bending resistance) so that it can be applied on a curved surface or can be manufactured in a roll-to-roll process.

Patent document 1 below discloses a structure of an organic EL element prepared by laminating a transparent electroconductive layer, an organic light-emitting medium layer and a cathode layer in this order on a plastic film sheet, and a metal foil is further laminated thereon via an adhesive layer. However, the plastic film sheet is unsatisfactory from the viewpoint of moisture barrier property and heat resistance.

Patent document 2 below discloses a substrate for flexible device provided with a flattening layer of a polyimide resin on a stainless steel sheet. However, it cannot provide a satisfactory moisture barrier property due to the high water-absorbing property of the polyimide resin.

Patent document 3 below discloses a flexible solar cell sheet prepared by forming a film of silica-based glass on a stainless steel sheet. However, typical silica-based glass has a thermal expansion coefficient smaller than that of stainless steel, and thus, it lacks adhesion to the stainless steel sheet. Another problem of the silica-based glass is that it is vulnerable to bending and impact.

For solving these problems, the present inventors propose in Patent document 4 a metal substrate for flexible device. The substrate is prepared by forming a nickel plating layer on a surface of a metal sheet, and coating electrical insulating bismuth-based glass on the surface of the nickel plating layer.

PRIOR ART DOCUMENTS

Patent Documents

Patent Document 1: JP 2004-171806 A
Patent Document 2: JP 2011-97007 A
Patent Document 3: JP 2006-80370 A
Patent Document 4: JP 2014-107053 A

SUMMARY OF THE INVENTION

Problems to be Solved by the Invention

The metal substrate for flexible device is prepared by coating bismuth-based glass on a metal sheet. Since the bismuth-based glass has excellent moisture barrier property and excellent adhesion to the metal sheet, the substrate has excellent insulation and flatness. Further, the substrate is light-weight and flexible. However, the fired surface of the glass layer may have seeding (minute protrusions) and cissing. These minute defects may impair smoothness of the glass layer.

When a steel material is used for the metal sheet, the cross section may be rusted. Even when a stainless steel sheet that is resistant against rusting is used for the metal sheet, sufficient adhesion may not be achieved between the substrate and the glass layer if the glass layer is formed directly on the stainless steel sheet. This may degrade the bending resistance and cause problems, for instance, the glass layer is broken and peeled off.

As a result of the studies on the problems, the present inventors discovered the causes of the problems. That is, the adhesion between the metal sheet and the glass layer is developed usually since the metal diffuses from the metal sheet into the glass layer and reacts with the glass component to form a reaction layer. In this case, the reaction layer may grow further as the diffusion amount and the diffusion distance of the metal from the metal sheet (distance in a thickness direction of the glass layer) are increased, and this can increase the adhesion. In the meantime, on the surface of the stainless steel, hydrated chromium oxyhydroxide is formed as a passivation film. Since the diffusion amount and the diffusion distance of chromium from this hydrated chromium oxyhydroxide are small, the reaction layer capable of sufficiently improving the adhesion cannot be formed on the glass layer. As a result, satisfactory adhesion cannot be obtained.

Therefore, an object of the present invention is to provide a substrate for flexible device, which is excellent in antirust property, moisture barrier property and adhesion of glass layer. This substrate is excellent also in bending resistance and surface smoothness of the glass layer surface.

Means for Solving the Problems

The present invention provides a substrate for flexible device. The substrate includes a stainless steel sheet, a nickel plating layer formed on a surface of the stainless steel sheet, and a glass layer of electrical insulating bismuth-based glass formed in a form of layer on a surface of the nickel plating layer.

It is preferable in the substrate for flexible device of the present invention that:
1. an oxide film having a roughened surface is formed on the surface of the nickel plating layer;
2. a nickel concentration at a depth of 10 nm from an interface in the thickness direction of the glass layer is not less than 0.1 atomic % when the interface is between the glass layer and the nickel plating layer or between the glass layer and the oxide film formed on the nickel plating layer;
3. a bismuth concentration at a depth of 10 nm from the interface in the thickness direction of either the nickel plating layer or the oxide film is not more than 20 atomic % when the interface is between the glass layer and the nickel plating layer or between the glass layer and the oxide film formed on the nickel plating layer; and
4. the bismuth-based glass contains $Bi_2O_3$, $ZnO$ and $B_2O_3$.

Effects of the Invention

In the substrate for flexible device of the present invention, rusting is prevented effectively by use of a stainless steel sheet. Furthermore, the adhesion between the stainless steel sheet and the glass layer is remarkably improved by forming a nickel plating layer on the stainless steel sheet. Since the substrate has excellent bending resistance, it has sufficient flexibility free from peeling or the like when used as a substrate for flexible device.

Further, since the oxide film is formed on the nickel plating layer and the glass layer is formed thereon, bubbles in the glass layer is reduced effectively, whereby a substrate having a glass layer excellent in surface smoothness and insulation can be provided.

Furthermore, since the substrate includes a glass layer having a dense structure for perfectly preventing moisture permeation, it is excellent also in moisture barrier property, and thus, it can be used efficiently as a substrate for organic EL.

Figures 1, 2:
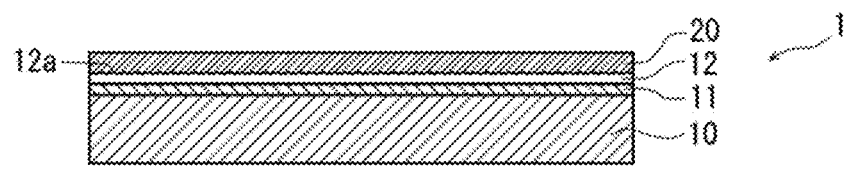
FIG. 1: a cross sectional view showing a structure of one example of substrate for flexible device of the present invention.
FIG. 2: a set of optical microphotographs showing glass uncoated surfaces and end faces of sheets used in Example 2 and Comparative Example 5.

MODE FOR CARRYING OUT THE INVENTION (Substrate for Flexible Device)

The substrate for flexible device of the present invention is prepared by forming a nickel plating layer on a surface of a stainless steel sheet, and forming a glass layer on the surface of this nickel plating layer. As a result, a sufficient amount of the nickel in the nickel plating layer is diffused sufficiently deep in the glass layer, so that a reaction layer sufficient to improve adhesion with the glass layer is formed to remarkably improve the adhesion therebetween. This serves to improve the bending resistance, and the substrate can be adapted to the roll-to-roll process without causing peeling of the glass layer as mentioned above.

In the substrate for flexible device of the present invention, the nickel is sufficiently diffused from the nickel plating layer into the glass layer, thereby improving the adhesion. This effect can be clarified by measuring the nickel concentration at a depth of 10 nm in the glass layer thickness direction from the interface between the nickel plating layer and the glass layer. At the depth of 10 nm, nickel is present in an amount of not less than 0.1 atomic %, and particularly not less than 3 atomic % to remarkably improve the adhesion. The results in Examples mentioned below further indicate that the bending resistance is also improved remarkably.

The results in Examples described later indicate that the concentration of nickel in the glass layer is decreased as the distance from the interface between the nickel plating layer and the glass layer is increased. Even so, if the concentration is within the range at the depth of 10 nm, the diffusion amount and the diffusion distance of the nickel are sufficient to obtain the aforementioned effects.

As mentioned above, the nickel plating layer is formed on the stainless steel sheet in order to improve the adhesion between the stainless steel sheet and the glass layer. This can impart adhesion to resist against bending, but it may generate bubbles in the glass layer. The bubbles formed on the glass layer surface may cause seeding and cissing to degrade the smoothness of the glass layer. In order to prevent such bubbles, it is preferable in the present invention that an oxide film is formed on the surface of the nickel plating layer formed on the stainless steel sheet.

That is, according to the study of the present inventors, when the glass layer is formed on the surface of the nickel plating layer, the reaction represented by the following formula seems to occur in the vicinity of the interface.

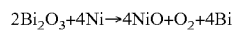

$$2Bi_2O_3 + 4Ni \rightarrow 4NiO + O_2 + 4Bi$$

This formula clarifies that $Bi_2O_3$ as the glass component is reduced to generate $O_2$ as bubbles. Meanwhile, in a case where an oxide film is formed on the nickel plating layer, the oxide film composed of nickel oxide and iron oxide forms an interface with the glass layer so as to prevent or control the reaction represented by the formula. This makes it difficult for $Bi_2O_3$ to be reduced, thereby preventing or decreasing generation of the bubbles.

Therefore, the present invention enables to prevent effectively generation of bubbles by forming an oxide film on the surface of the nickel plating layer. Furthermore, reaction between the oxide film and the glass can further strengthen the adhesion between the sheet and the glass layer.

The generation of bubbles has a correlation with the amount of the glass component diffused into the sheet surface layer. In the substrate for flexible device of the present invention where generation of bubbles (oxygen) is controlled, the bismuth concentration at a depth of 10 nm in the thickness direction of the sheet surface layer (nickel plating layer or oxide film) from the interface between the sheet surface layer and the glass layer is not more than 20 atomic %, and particularly not more than 15 atomic %. This indicates that diffusion of glass component from the glass layer into the sheet surface layer is prevented or controlled. Namely, since the bubbles (oxygen) are generated by the reduction of glass, more bubbles (oxygen) are generated when the glass component is diffused more into the sheet surface layer. As a result, in a case where more than 20 atomic % of bismuth is present at a depth of 10 nm, a large amount of glass component will be diffused into the sheet surface layer, thereby increasing the bubbles in the glass layer.

As the results of Examples described below clarify, the bismuth concentration in the sheet surface layer is decreased as the distance from the interface between the nickel plating layer and the glass layer is increased. Therefore, when the bismuth concentration is within the aforementioned range at a point of 10 nm from the interface, it indicates that the diffusion of the glass component into the sheet surface layer is prevented or controlled and that the aforementioned effect is provided.

A first feature of the substrate for flexible device of the present invention is that the substrate has a stainless steel sheet 10, a nickel plating layer 11 formed on a surface of the stainless steel sheet 10, and a glass layer 20 of an electrical insulating bismuth-based glass formed in the form of layer on a surface of the nickel plating layer 11, which are illustrated in a cross-sectional view of FIG. 1. More specifically, in the specific example shown in FIG. 1, an oxide film 12 having a roughness 12a is formed on the surface of the nickel plating layer 11.

[Stainless Steel Sheet]

Any conventionally known stainless steel materials can be used for the stainless steel sheet for the substrate for flexible device of the present invention. Among the materials, ferritic stainless steel can be used particularly preferably. It is preferable to use a material having a thermal expansion coefficient of $9.9 \times 10^{-6}$ to $21 \times 10^{-6}/°$ C., in particular, $10 \times 10^{-6}$ to $14 \times 10^{-6}/°$ C.

It is preferable that the stainless steel sheet has a thickness in a range of 10 to 200 μm, and particularly in a range of 25 to 100 μm, to obtain sufficient flexibility.

[Nickel Plating Layer]

In the substrate for flexible device of the present invention, the nickel plating layer formed on the stainless steel sheet surface is a layer formed by nickel plating, and the plating may be electrolytic plating or electroless plating as described below. Though the nickel plating layer is formed on only one surface of the stainless steel sheet in the example shown in FIG. 1, it may be formed on both surfaces of the stainless steel sheet.

Preferably, the nickel plating layer has a thickness in a range of 0.1 to 10 μm, and in particular 0.5 to 5 μm. In a case where the thickness of the nickel plating layer is less than the range, adhesion to the glass layer may be inferior in comparison with a case where the thickness is within the range. Even when the thickness of the nickel plating layer is greater than the range, further improvement in the effect cannot be expected, and the sheet may be inferior from the economic viewpoint. When an oxide film is formed, the thickness of the nickel plating layer may include the thickness of the oxide film.

The nickel plating layer may have an alloy layer on the interface with the stainless steel sheet.

As mentioned above, it is preferable that the oxide film is formed on the surface of the nickel plating layer of the substrate for flexible device of the present invention, thereby preventing or controlling generation of bubbles.

The nickel layer serves to improve the adhesion in the aforementioned manner. In addition, an adhesion layer is formed by reaction between the oxide film and the glass, and this can further improve the adhesion between the stainless steel sheet and the glass layer.

The oxide film is composed of nickel oxide and an iron oxide. The nickel oxide is formed by firing the surface of the nickel-plating layer in an oxygen-containing atmosphere as described below, and the iron oxide is diffused from the stainless steel sheet.

In the present invention, protrusions that are presumed as crystal grains are formed on the surface of the oxide film so as to form roughness (roughened surface), thereby preventing the glass composition from spreading during formation of the glass layer so as to effectively prevent or control cissing. Further, since the nickel plating layer is fired, a desorbed gas is released from the nickel plating layer so as to effectively prevent or control bubbles that may cause cissing.

It is preferable that the roughness on the oxide film surface (surface roughness) is imparted so that the arithmetic mean roughness (Ra) is in a range of 30 to 100 nm, and in particular in a range of 50 to 90 nm, and the maximum height roughness (Rz) is in a range of 420 to 900 nm, and in particular in a range of 600 to 850 nm.

It is preferable that the oxide film has a thickness in a range of 10 to 1200 nm, and particularly preferably 100 to 1000 nm. When the oxide film has a thickness less than the range, the surface modification of the nickel plating layer may be insufficient in comparison with a case where the thickness is within the range. When the oxide film has a thickness greater than the range, the surface layer of the nickel plating layer may be alloyed further in comparison with a case where the thickness is within the range, and it may weaken the nickel plating layer and impair the flexibility.

[Glass Layer]

The substrate for flexible device of the present invention comprises an insulating layer formed on either the aforementioned nickel plating layer or the oxide film that has a roughened surface and that is formed on the nickel plating layer. The insulating layer is a glass layer of bismuth-based glass having an excellent moisture barrier property and excellent adhesion to a metal sheet.

In the present invention, bismuth-based glass containing $Bi_2O_3$, ZnO and $B_2O_3$ can be preferably used. Namely, ZnO and $B_2O_3$ are contained as essential components together with $Bi_2O_3$ as the main component, and thus, these components are within the range of eutectic points. This can form a non-crystalized glass network structure. By combining the glass with the aforementioned nickel plating layer, it is possible to provide a substrate for flexible device where cissing on the glass surface can be effectively prevented and controlled.

For the bismuth-based glass, electrical insulating glass having a softening point in a range of 300 to 500° C. is preferred. Glass containing $Bi_2O_3$ as a main component (particularly not less than 70% by weight) for the glass composition is preferred. It is particularly preferable that the glass is bismuth-based non-lead glass containing 70 to 84% by weight of $Bi_2O_3$, 10 to 12% by weight of ZnO, and 6 to 12% by weight of $B_2O_3$ though the present invention is not limited to this example. When these components are contained within these ranges, crystallization of the glass layer is prevented or controlled, and cissing may be prevented effectively.

The bismuth-based glass contains further $SiO_2$ and/or $Al_2O_3$ in addition to the aforementioned essential components. It is preferable that the content of $SiO_2$ is 0 to 2% by weight, and the content of $Al_2O_3$ is 0 to 1% by weight. As a result of blending at least one of these components, the moisture barrier property and the durability can be improved to stabilize the glass layer.

It is preferable that the bismuth-based glass contains further CuO and/or NiO in addition to the aforementioned essential components. The melting property of the glass can be improved by blending not more than 2% by weight of CuO and not more than 2% by weight of NiO.

Further, the bismuth-based glass may contain 1.5% by weight or less of any of $Y_2O_3$, $ZrO_2$, $La_2O_3$, $CeO_2$, $TiO_2$, CoO, and $Fe_2O_3$ in addition to the aforementioned essential components. These components can improve the durability of glass, though excessive blend amounts of these components may degrade the durability of the glass. These components can be used in combination of at least two thereof. In the case, the total amount is preferably not more than 1.5% by weight.

In the present invention, the glass layer preferably has a thickness in a range of 2 to 45 μm, and particularly in a range of 5 to 20 μm. When the thickness of the glass layer is less than the range, sufficient insulation may not be achieved in comparison with a case where the thickness is within the range. Furthermore, the roughened surface of the oxide film may not be smoothened sufficiently in a case of forming an oxide film on the nickel plating layer. When the thickness is greater than the range, the flexibility may be inferior in comparison with a case where the thickness is within the range.

(Method for Producing Substrate for Flexible Device)

The substrate for flexible device of the present invention can be produced by a method including a plating step of forming a nickel plating layer on at least one surface of a stainless steel sheet; and a glass layer forming step of forming a bismuth-based glass layer on the nickel plating layer. In a case of forming an oxide film on the nickel plating layer, an oxide film forming step is further conducted between the plating step and the glass layer forming step. In the oxide film forming step, the nickel plating layer is fired in an oxygen-containing atmosphere so as to form the oxide film on the surface of the nickel plating layer.

[Step of Forming Nickel Plating Layer]

The formation of a nickel plating layer on a substrate for flexible device of the present invention can be conducted by any conventional method.

For the step of forming a nickel plating layer, the sheet is degreased by alkaline electrolysis or the like, washed in water, and then subjected to a conventionally-known pre-treatment such as acid pickling by immersion in sulfuric acid or the like prior to the plating.

The pre-treated stainless steel sheet is plated as described above in any conventionally-known methods such as electrolytic plating and electroless plating, so that the nickel plating layer can be formed. The electrolytic plating is preferred from the viewpoint of consecutive productivity. For the nickel plating bath, any bathing widely used such as watt bath and sulfamic acid bath can be used under known electrolysis conditions in accordance with known formulation. As mentioned above, the nickel plating layer is preferably formed to have a thickness in a range of 0.1 to 10 μm, and in particular 0.5 to 5 μm.

[Step of Forming Oxide Film]

In the method for producing the substrate for flexible device of the present invention, the nickel plating layer formed on the stainless steel sheet is fired in the oxygen-containing atmosphere (hereinafter, this may be called "baking"), thereby forming a roughened oxide film on the surface of the nickel plating layer.

The conditions for baking are not limited particularly as long as the aforementioned oxide film can be formed, but preferably, the temperature for baking is in a range of 550 to 1000° C., and in particular 600 to 950° C. The baking time can be modified suitably depending on the oxygen concentration and firing temperature of the oxygen-containing atmosphere. In a case of firing in air within the aforementioned temperature range, it is preferable to fire for 5 to 120 seconds at the baking temperature.

As mentioned above, the oxide film is formed to have a thickness in a range of 10 to 1200 nm, preferably in a range of 100 to 1000 nm.

Depending on the conditions for baking, an alloy layer may be formed on the surface of the nickel plating layer by firing for formation of the oxide film during the step.

[Step of Forming Glass Layer]

Next, a bismuth-based glass layer is formed on the nickel plating layer or on the oxide film formed on the nickel plating layer.

In the step of forming a glass layer, usually a glass powder and a vehicle are mixed and dispersed to prepare glass paste, which is coated and dried on the nickel plating layer or on the oxide film on the surface of the nickel plating layer, and fired, though the procedures are not limited to this example.

<Preparation of Glass Paste>

In preparation of glass paste, a glass frit of the aforementioned glass composition is pulverized to form a glass composition powder, which is then mixed with a vehicle and dispersed.

The glass composition powder is obtained by mixing the glass compositions, heating at a temperature in a range of 800 to 1200° C. to form molten glass, quenching to obtain a glass frit, and then, pulverizing the glass frit. The pulverization may be conducted by any conventionally known method, and the examples include JET pulverization, rapid mill pulverization, and ball mill pulverization.

For smoothening the glass surface, the glass composition powder has an average particle diameter of not more than 20 μm, preferably in a range of 1 to 10 μm, and more preferably 1 to 5 μm. The JET pulverization is preferred for obtaining the fine powder.

Then, the thus obtained glass composition powder and the vehicle are mixed and dispersed. Examples of the mixing-dispersion method includes dispersion using a rotary mixer having a stirring blade, a beads mill, a paint shaker, a roll mill, an agate mortar, and ultrasonic waves. It is preferable that mixing and dispersing are conducted by using a beads mill, a paint shaker or a roll mill.

Known thickeners, dispersants or the like can be added as required to the glass paste according to known formulation.

The vehicle to be mixed with the glass composition powder so as to compose the paste is used for adjusting viscosity of the paste. The vehicle is prepared by solving an organic binder in a solvent.

It is preferable that the glass paste contains the glass composition powder in an amount of 30 to 80% by weight, the organic binder in an amount of more than 0 and not more than 10% by weight, and the solvent in an amount of 10 to 70% by weight. When the amount of the glass composition powder is smaller than the range, the paste viscosity is lowered to make it difficult to form the glass layer having a desired thickness. When the amount of the glass composition powder is greater than the range, the paste viscosity becomes extremely high to degrade the coatability. When the amount of the organic binder is smaller than the range, the coatability will be degraded. When the amount of the organic binder is greater than the range, unfired organic materials may remain after the firing step. Further, when the amount of the solvent is smaller than the range, the paste viscosity becomes extremely high to degrade the coatability. And when the amount of the solvent is greater than the range, the paste viscosity becomes extremely low to make it difficult to form a glass layer having a desired thickness.

For the vehicle, any conventionally known solvent-based or aqueous vehicles can be used, and the examples include the following organic binders and solvents, though the present invention is not limited to these examples.

Examples of the organic binder include: cellulose-based resins such as methyl cellulose, ethyl cellulose, carboxymethyl cellulose, oxyethyl cellulose, benzyl cellulose, propyl cellulose, and nitrocellulose; organic resins like an acrylic resin obtained by polymerizing at least one acrylic monomer, such as methyl methacrylate, ethyl methacrylate, butyl methacrylate, 2-hydroxyethyl methacrylate, butyl acrylate, and 2-hydroxyethyl acrylate; and aliphatic polyolefin-based carbonate resins such as polypropylene carbonate, though the present invention is not limited to the examples.

The solvent may be selected suitably according to the organic binder in use. The examples include: water, terpineol, butyl carbitol acetate, ethyl carbitol acetate and the like for the cellulose-based resins; methyl ethyl ketone, terpineol, butyl carbitol acetate, ethyl carbitol acetate or the like for the acrylic resins; and propylene carbonate, triacetin or the like for the aliphatic polyolefin-based carbonate, though the present invention is not limited to the examples.

<Coating, Drying and Firing of Glass Paste>

The thus prepared glass paste is coated on the nickel plating layer or on the oxide film by a coating method selected in accordance with the viscosity of the glass paste. The coating can be conducted by using a bar coater, a die coater, a roll coater, a gravure coater, screen printing, offset printing, an applicator or the like though the present invention is not limited to these examples.

The coated glass paste is dried at a temperature in a range of 80 to 180° C. After drying, a debinding treatment is conducted as required. Preferably, the debinding treatment is conducted by heating for 10 minutes or more at a temperature in a range of 180 to 450° C.

After drying, the coated surface that is subjected in advance to the debinding treatment as required is fired for 10 to 300 seconds at a temperature of 550 to 900° C., preferably 650 to 900° C. When the firing temperature is lower than this range, melting may be insufficient in comparison with a case where the temperature is within the range. When the firing temperature is higher than the range, the nickel plating layer may be affected in comparison with a case where the temperature is within the range.

EXAMPLES

1. Stainless Steel Sheet

Five types of stainless steel sheets having a thickness of 0.05 mm were used.

NK-430MA: ferritic stainless steel foil (manufactured by Nippon Kinzoku Co., Ltd.)

NCA-1: ferritic stainless steel foil (manufactured by Nippon Steel Nisshin Co., Ltd.)

SUS430: ferritic stainless steel foil
SUS304: austenitic stainless steel foil
SUS316L: austenitic stainless steel foil For a steel sheet to be used in Comparative Examples, a steel plate obtained by anneal-degreasing a cold-rolled plate (thickness: 0.05 mm) of ordinary steel was prepared.

Next, the sheet (dimension: 20 cm in length and 50 cm in width) was subjected to alkaline electrolytic degreasing and acid pickling by immersion in sulfuric acid.

2. Sheet Treatment

The sheet surface was subjected to treatment of any one or combined treatments of Baking-1, Nickel-plating and Baking-2 as shown in Table 1.

(1) Baking-1

As shown in Table 1, the surface of the stainless steel sheet was heated in air at a temperature of 950° C. for 20 seconds.

(2) Nickel-Plating

As shown in Table 1, a stainless steel sheet and the steel plate neither of which had been subjected to the Baking-1 were nickel-plated under the conditions as described below, thereby forming nickel plating layers each having a thickness of 2 μm on both surfaces of the sheet or the plate.

Bath composition: nickel sulfate of 300 g/L; nickel chloride of 40 g/L; boric acid of 35 g/L; and pit inhibitor (sodium lauryl sulfate) of 0.4 mL/L
pH: 4 to 4.6
Bath temperature: 55° C. to 60° C.
Current density: 25 A/dm$^2$ (3) Baking-2

As shown in Table 1, the surface of the sheet plated with nickel alone was heated in air at a temperature of 950° C. for 20 seconds similarly to Baking-1.

3. Formation of Glass Layer

In a degreasing step, the surface of each specimen was wiped off with gauze soaked in alcohol for the purpose of degreasing.

In a coating formation step, a vehicle as a mixture of an organic solvent and a binder was prepared. The vehicle was mixed in a mortar with a bismuth-based glass composition powder described in Table 5 at a weight ratio of 25:75. The mixture was dispersed using a ceramic roll mill to produce a glass paste for coating. The glass paste was coated on the specimen by using a bar coater such that the film thickness after firing would be 10 μm. Later, the glass firing step was conducted using an electric furnace by drying (temperature: 110° C., time: 20 minutes), debinding (temperature: 330° C., time: 20 minutes) and firing (temperature: 850° C., time: 30 seconds) to form a glass layer.

4. Evaluation (1) Salt Spray Testing (SST)

The substrates for flexible devices produced in Examples and Comparative Examples were subjected to salt spraying testing in accordance with JIS Z 2371. The results are shown in Table 1. FIG. 2 includes optical micrographs of glass uncoated surfaces and end faces of sheets used in Example 2 and Comparative Example 5.

(2) Bending Resistance

The substrates for flexible devices, which were produced in Examples and Comparative Examples, were wound on cylindrical iron bars each having a diameter (φ) of 30 mm, 20 mm and 10 mm such that the glass layer would make the outer/inner surface. These objects were observed visually to check peeling and cracks. The results are shown in Table 1.

The criteria for evaluation are as follows.

Peeling and Cracks Caused by the Winding Test (Visual Observation)

○: There is no peeling from glass/sheet interface and no crack.

Δ: There is no peeling from glass/sheet interface but there are tiny cracks.

X: There is no peeling from glass/sheet interface but there are small cracks.

The comprehensive evaluation is as follows.

⊚: The evaluations for φ30, φ20, and φ10 are all ○.

○: The evaluations for φ30 and φ20 are all ○, while the evaluations for φ10 include Δ or X.

Δ: All of the evaluations for φ30 were ○, while the evaluations for φ20 and φ10 include Δ or X.

X: The evaluations for φ00, φ20 or φ10 include Δ or X.

(3) Nickel Concentration in Glass Layer

For the glass layer of the substrate for flexible devices produced in Examples 1, 2 and Comparative Examples 1, 2, 12 and 13, the nickel concentration at a depth of 10 nm, 20 nm and 50 nm from the interface between the glass layer and the sheet were measured by an analysis using energy-dispersive X-ray spectroscopy (EDS). The results are shown in Table 2.

(4) Thickness and Surface Roughness of Oxide Film

The thickness of the oxide film of the substrate for flexible device obtained in Examples 1, 2 and Comparative Examples 1-4, 12 and 13 was measured using a field emission auger microprobe (AES: manufactured by JEOL, PN: JAMP-9500F). Further, the arithmetic mean roughness (Ra) and the maximum height roughness (Rz) of the oxide films of substrates for flexible devices produced in Examples 1-4 and Comparative Examples 1-4, 12 and 13 were measured in SPM measurement mode in accordance with JIS B 0601 by using a microscope (PN: OLS3500, Nano Search Microscope manufactured by Olympus Corporation). The results are shown in Table 3.

(5) Bismuth Concentration in Sheet

For the sheets of the substrates for flexible devices produced in Examples 1, 2 and Comparative Examples 1, 2, 12 and 13, the nickel concentration at a depth of 10 nm, 20 nm and 50 nm from the interface between the glass layer and the sheet were measured by an analysis using energy-dispersive X-ray spectroscopy (EDS). The results are shown in Table 4.

(6) Bubbles in Glass Layer

For the glass layers of the substrates for flexible devices produced in Examples 1, 2 and Comparative Examples 1-4, 12 and 13, bubbles in the glass layer were checked through observation by use of a microscope (PN: OLS3500, Nano Search Microscope manufactured by Olympus Corporation). Specifically, after focusing on the surface of the glass layer, observation was performed while shifting the focus in the depth direction of the glass layer. The results are shown in Table 3.

TABLE 1

| | | Sheet treatment | | | Rust after SST test | Bending resistance | | | | | | Comprehensive evaluation on bending resistance |
|---|---|---|---|---|---|---|---|---|---|---|---|---|
| | | | | | | Wound with glass layer arranged outside (convex) | | | Wound with glass layer arranged inside (concave) | | | |
| | Sheet | Baking-1 | Ni-plating | Baking-2 | | φ30 | φ20 | φ10 | φ30 | φ20 | φ10 | |
| Example 1 | NK-430MA | No | Yes | No | No | ○ | ○ | ○ | ○ | ○ | ○ | ◎ |
| Example 2 | NK-430MA | No | Yes | Yes | No | ○ | ○ | ○ | ○ | ○ | ○ | ◎ |
| Example 3 | NCA-1 | No | Yes | No | No | ○ | ○ | ○ | ○ | ○ | ○ | ◎ |
| Example 4 | NCA-1 | No | Yes | Yes | No | ○ | ○ | ○ | ○ | ○ | ○ | ◎ |
| Example 5 | SUS430 | No | Yes | Yes | Yes | ○ | ○ | ○ | ○ | ○ | ○ | ◎ |
| Comparative Example 1 | NK-430MA | No | No | No | No | △ | X | X | ○ | ○ | X | X |
| Comparative Example 2 | NK-430MA | Yes | No | No | No | ○ | X | X | ○ | ○ | ○ | △ |
| Comparative Example 3 | NCA-1 | No | No | No | No | △ | X | X | ○ | ○ | ○ | X |
| Comparative Example 4 | NCA-1 | Yes | No | No | No | ○ | X | X | ○ | ○ | ○ | △ |
| Comparative Example 5 | Steel | No | Yes | Yes | Yes | ○ | ○ | ○ | ○ | ○ | ○ | ◎ |
| Comparative Example 6 | SUS304 | No | No | No | Yes | ○ | ○ | X | ○ | ○ | ○ | ○ |
| Comparative Example 7 | SUS304 | Yes | No | No | Yes | ○ | ○ | X | ○ | ○ | ○ | ○ |
| Comparative Example 8 | SUS316L | No | No | No | Yes | ○ | X | X | ○ | ○ | X | △ |
| Comparative Example 9 | SUS316L | Yes | No | No | Yes | ○ | X | X | ○ | ○ | ○ | △ |
| Comparative Example 10 | SUS430 | No | No | No | Yes | △ | X | X | ○ | ○ | X | X |
| Comparative Example 11 | SUS430 | Yes | No | No | Yes | △ | X | X | ○ | ○ | ○ | X |

TABLE 2

| | | Sheet treatment | | | Nickel concentration in glass thickness direction from interface (atomic %) | | | Comprehensive evaluation on bending resistance |
|---|---|---|---|---|---|---|---|---|
| | | | | | 10 nm depth | 20 nm depth | 50 nm depth | |
| | Sheet | Baking-1 | Ni-plating | Baking-2 | | | | |
| Example 1 | NK-430MA | No | Yes | No | 3.77 | 3.42 | 3.05 | ◎ |
| Example 2 | NK-430MA | No | Yes | Yes | 5.68 | 4.61 | 3.72 | ◎ |
| Comparative Example 1 | NK-430MA | No | No | No | 0.07 | 0.00 | 0.00 | X |
| Comparative Example 2 | NK-430MA | Yes | No | No | 0.01 | 0.30 | 0.22 | △ |
| Comparative Example 12 | Steel | No | Yes | Yes | Not measured | Not measured | 1.78 | ◎ |
| Comparative Example 13 | Steel | No | Yes | No | Not measured | Not measured | 2.20 | ◎ |

TABLE 3

| | | Sheet treatment | | | Surface oxide film | | | |
| | Sheet | Baking-1 | Ni-plating | Baking-2 | Thickness (nm) | Surface roughness (nm) Ra | Rz | Bubble in glass layer |
|---|---|---|---|---|---|---|---|---|
| Example 1 | NK-430MA | No | Yes | No | 7.7 | 25.2 | 275.7 | Yes |
| Example 2 | NK-430MA | No | Yes | Yes | 500.0 | 35.1 | 491.2 | No |
| Example 3 | NCA-1 | No | Yes | No | Not measured | 32.9 | 308.2 | Yes |
| Example 4 | NCA-1 | No | Yes | Yes | Not measured | 39.0 | 556.6 | No |
| Comparative Example 1 | NK-430MA | No | No | No | 7.8 | 17.0 | 197.3 | No |
| Comparative Example 2 | NK-430MA | Yes | No | No | 64.0 | 13.6 | 202.0 | No |
| Comparative Example 3 | NCA-1 | No | No | No | 18.6 | 13.5 | 144.4 | No |
| Comparative Example 4 | NCA-1 | Yes | No | No | 79.0 | 23.3 | 228.4 | No |
| Comparative Example 12 | Steel | No | Yes | Yes | 500.0 | 52.0 | 690.0 | No |
| Comparative Example 13 | Steel | No | Yes | No | 10.0 | 30.0 | 491.0 | Yes |

TABLE 4

| | | Sheet treatment | | | Bismuth concentration in sheet thickness direction from interface (atomic %) | | | |
| | Sheet | Baking-1 | Ni-plating | Baking-2 | 10 nm depth | 20 nm depth | 50 nm depth | Bubble in glass layer |
|---|---|---|---|---|---|---|---|---|
| Example 1 | NK-430MA | No | Yes | No | 20.93 | 22.44 | 10.82 | Yes |
| Example 2 | NK-430MA | No | Yes | Yes | 0.49 | 0.16 | 0.05 | No |
| Comparative Example 1 | NK-430MA | No | No | No | 10.72 | 5.54 | 0.64 | No |
| Comparative Example 2 | NK-430MA | Yes | No | No | 0.01 | 0.02 | 0.00 | No |
| Comparative Example 12 | Steel | No | Yes | Yes | Not measured | Not measured | 0.20 | No |
| Comparative Example 13 | Steel | No | Yes | No | Not measured | Not measured | 0.15 | Yes |

TABLE 5

| Component | Composition (wt %) |
|---|---|
| $Bi_2O_3$ | 81.00 |
| ZnO | 10.87 |
| $B_2O_3$ | 6.21 |
| $SiO_2$ | 1.31 |
| $Al_2O_3$ | 0.47 |
| CuO | 0.14 |
| NiO | 0.00 |
| Total | 100.00 |

INDUSTRIAL APPLICABILITY

The substrate for flexible device of the present invention has an excellent antirust property, moisture barrier property, insulation, bending resistance, and surface smoothness and adhesion of the glass layer. It can be suitably used as a substrate for organic EL lighting, organic EL displays, organic thin film solar cells and the like.

EXPLANATIONS OF LETTERS OR NUMERALS

1: substrate for flexible device
10: stainless steel sheet
11: nickel plating layer
12: oxide film
20: glass layer

The invention claimed is:

1. A substrate for flexible device, including a stainless steel sheet, a nickel plating layer formed on a surface of the stainless steel sheet, and a glass layer of electrical insulating bismuth-based glass formed in a form of layer on a surface of the nickel plating layer, wherein an oxide film having a roughened surface formed by protrusions of crystal grains is formed on the surface of the nickel plating layer, the oxide film having a thickness in a range of 10 to 1200 nm.

2. The substrate for flexible device according to claim 1, wherein a nickel concentration at a depth of 10 nm from an interface in a thickness direction of the glass layer is not less than 0.1 atomic % when the interface is between the glass layer and the oxide film.

3. The substrate for flexible device according to claim 1, wherein a bismuth concentration at a depth of 10 nm from the interface in the thickness direction of the oxide film is not more than 20 atomic % when the interface is between the glass layer and the oxide film.

4. The substrate for flexible device according to claim 1, wherein the bismuth-based glass contains $Bi_2O_3$, ZnO and $B_2O_3$.

5. A substrate for flexible device, including a stainless steel sheet, a nickel plating layer formed on a surface of the stainless steel sheet, a glass layer of electrical insulating bismuth-based glass formed in a form of layer on a surface of the nickel plating layer, and a nickel oxide film having a roughened surface formed by protrusions of crystal grains arranged at an interface between the nickel plating layer and the glass layer, wherein the nickel oxide film has a thickness in a range of 10 to 1200 nm and is formed by firing a surface of the nickel plating layer in an oxygen-containing atmosphere at a temperature of 550° to 1000° C. for 5 to 120 seconds.

6. The substrate for flexible device according to claim 5, wherein the nickel oxide film contains iron oxide which has diffused from the stainless steel sheet.

7. The substrate for flexible device according to claim 1, wherein the roughened surface of the oxide film has an arithmetic mean roughness (Ra) in a range of 30 to 100 nm and a maximum height roughness (Rz) in a range of 420 to 900 nm.

8. The substrate for flexible device according to claim 5, wherein the roughened surface of the nickel oxide film has an arithmetic mean roughness (Ra) in a range of 30 to 100 nm and a maximum height roughness (Rz) in a range of 420 to 900 nm.

* * * * *